(12) United States Patent
Park et al.

(10) Patent No.: US 9,178,003 B2
(45) Date of Patent: Nov. 3, 2015

(54) ORGANIC LIGHT-EMITTING DIODE (OLED) DISPLAY

(71) Applicant: Samsung Display Co., Ltd., Yongin, Gyeonggi-Do (KR)

(72) Inventors: Kyung-Hoon Park, Yongin (KR); Sun Park, Yongin (KR); Yeong-Ho Song, Yongin (KR); Ji-Hoon Song, Yongin (KR); Chun-Gi You, Yongin (CN); Yul-Kyu Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/460,176

(22) Filed: Aug. 14, 2014

(65) Prior Publication Data

US 2015/0102316 A1    Apr. 16, 2015

(30) Foreign Application Priority Data

Oct. 15, 2013  (KR) .......................... 10-2013-0122950

(51) Int. Cl.
```
H01L 27/32    (2006.01)
H01L 27/12    (2006.01)
H01L 49/02    (2006.01)
H01L 51/52    (2006.01)
```

(52) U.S. Cl.
CPC ........ H01L 27/3258 (2013.01); H01L 27/1255 (2013.01); H01L 27/3246 (2013.01); H01L 51/5203 (2013.01); H01L 51/5271 (2013.01)

(58) Field of Classification Search
CPC ............ H01L 27/3258; H01L 27/3246; H01L 27/1255; H01L 51/5271; H01L 51/5203; H01L 28/60
See application file for complete search history.

(56) References Cited

U.S. PATENT DOCUMENTS

| | | | |
|---|---|---|---|
| 2008/0157654 A1* | 7/2008 | Cok | 313/504 |
| 2008/0197342 A1* | 8/2008 | Lee et al. | 257/40 |
| 2009/0315451 A1* | 12/2009 | Choi et al. | 313/504 |
| 2010/0045173 A1* | 2/2010 | Kwon et al. | 313/504 |
| 2011/0297944 A1* | 12/2011 | Choi et al. | 257/59 |
| 2011/0303922 A1* | 12/2011 | Cho et al. | 257/71 |
| 2012/0001207 A1* | 1/2012 | Lee et al. | 257/89 |
| 2012/0074412 A1* | 3/2012 | Kim | 257/59 |
| 2012/0097952 A1* | 4/2012 | Kang et al. | 257/59 |
| 2013/0126882 A1 | 5/2013 | You et al. | |
| 2013/0168655 A1* | 7/2013 | Yun et al. | 257/40 |

FOREIGN PATENT DOCUMENTS

| | | |
|---|---|---|
| KR | 10-2011-0133925 A | 12/2011 |
| KR | 10-2013-0055446 A | 5/2013 |

* cited by examiner

*Primary Examiner* — Erik Kielin
(74) *Attorney, Agent, or Firm* — Knobbe, Martens, Olson & Bear, LLP

(57) ABSTRACT

An organic light-emitting diode (OLED) display is disclosed. In one aspect, the OLED display includes a thin film transistor including an active layer, a gate electrode, a source electrode, and a drain electrode, a first insulating layer arranged between the active layer and the gate electrode, and a second insulating layer arranged between the gate, source, and drain electrodes. The OLED display also includes a third insulating layer covering the source and drain electrodes, wherein an opening is defined in each of the second and third insulating layers and wherein the openings substantially overlap. The OLED display further includes a pixel electrode formed in the openings defined in the second and third insulating layers and including a semi-permeable metal layer.

20 Claims, 10 Drawing Sheets

ORGANIC LIGHT-EMITTING DIODE (OLED) DISPLAY

CROSS-REFERENCE TO RELATED APPLICATIONS

This application claims the benefit of Korean Patent Application No. 10-2013-0122950, filed on Oct. 15, 2013, in the Korean Intellectual Property Office, the disclosure of which is incorporated herein in its entirety by reference.

BACKGROUND

1. Field

The described technology generally relates to an organic light-emitting diode (OLED) display.

2. Description of the Related Technology

The standard OLED display includes a hole injection electrode, an electrode injection electrode, and an organic light-emitting layer formed between the hole injection electrode and the electron injection electrode. OLED displays are self-emissive displays. In an OLED display, holes injected from the hole injection electrode and electrons injected from the electron injection electrode are recombined and emit light during decay. OLED displays have high-quality features such as low power consumption, high brightness, and fast response speeds, thereby gaining attention as a next-generation display.

SUMMARY OF CERTAIN INVENTIVE ASPECTS

One inventive aspect is an OLED display having high luminescence efficiency, high yield rate, and improved display quality.

Another aspect is an OLED display apparatus including a thin film transistor including an activation layer, a gate electrode, a source electrode, and a drain electrode, a first insulating layer arranged between the activation layer and the gate electrode, a second insulating layer arranged between the gate, source, and drain electrodes, a third insulating layer for covering the source and drain electrodes, a pixel electrode arranged in apertures formed in the second and third insulating layers, and including a semi-permeable metal layer, a fourth insulating layer where a part covering an end of the pixel electrode is disposed in the aperture formed in the third insulating layer, an intermediate layer arranged on the pixel electrode and including an organic light-emitting layer, and an opposite electrode arranged on the intermediate layer and including a reflective material.

The thickness of the fourth insulating layer may be smaller than that of the third insulating layer.

The third insulating layer may be an organic insulating layer.

The fourth insulating layer may be an organic insulating layer.

The pixel electrode may be electrically connected to any one of the source and drain electrodes through a pixel electrode contact unit disposed between the first and second insulating layers.

The pixel electrode contact unit may include: a first contact layer protruded from etched surfaces of the apertures formed in the second and third insulating layers and a second contact layer interposed between the first contact layer and the second insulating layer.

The OLED display may further include an optical property control layer interposed between the first insulating layer and the pixel electrode.

The thickness of the optical property control layer may be in a range of about 200 Å to about 800 Å.

The optical property control layer may include a transparent conductive oxide.

The semi-permeable metal layer may include silver (Ag) or a silver (Ag) alloy.

The source and drain electrodes may be formed by stacking a plurality of layers formed of different metals having different electron mobility.

The source and drain electrodes may include a layer including molybdenum and a layer including aluminum.

The OLED display may further include a capacitor including a first electrode arranged on the same layer as the activation layer and a second electrode arranged on the same layer as the gate electrode.

The first electrode of the capacitor may include a semiconductor material doped with ion impurities.

The second electrode of the capacitor may include a transparent conductive oxide.

The OLED display may further include: a first pad layer formed of the same material as the source and drain electrodes and a second pad layer disposed on the first pad layer.

The second pad layer may be formed of the same material as the optical property control layer interposed between the first insulating layer and the pixel electrode.

The OLED display may further include a covering layer for covering a top of the third insulating layer and a top of the fourth insulating layer.

The covering layer may include a transparent conductive oxide.

Apertures that are respectively formed on the second, third, and fourth insulating layers may overlap each other.

DETAILED DESCRIPTION OF CERTAIN INVENTIVE EMBODIMENTS

Figure 1:
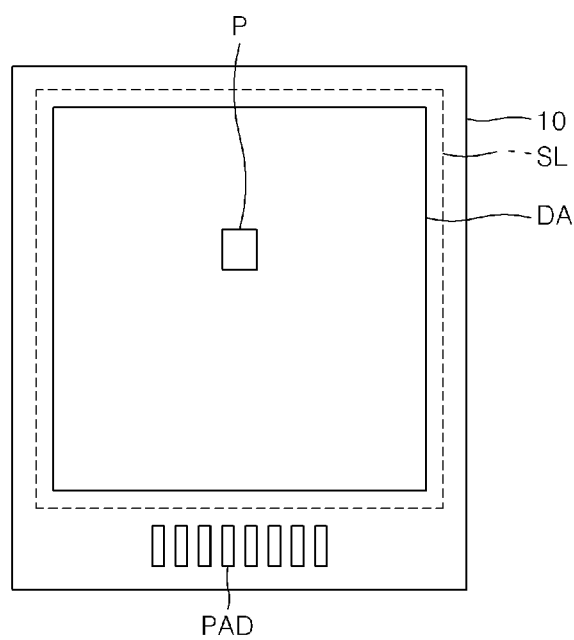
FIG. 1 is a plan view schematically illustrating an OLED display according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, the described technology will be described in detail by explaining preferred embodiments of the described technology with reference to the attached drawings. Like reference numerals in the drawings denote like elements, and thus, their description will be omitted.

It will be understood that although the terms first and second are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on" another element or layer, the element or layer can be directly on another element or layer or intervening elements or layers can also be present.

In the drawings, the sizes and the thicknesses of layers and regions may be exaggerated for convenience of explanation, and thus, the sizes and the thicknesses of the illustrated layers and regions are not limited thereto.

Figure 2:
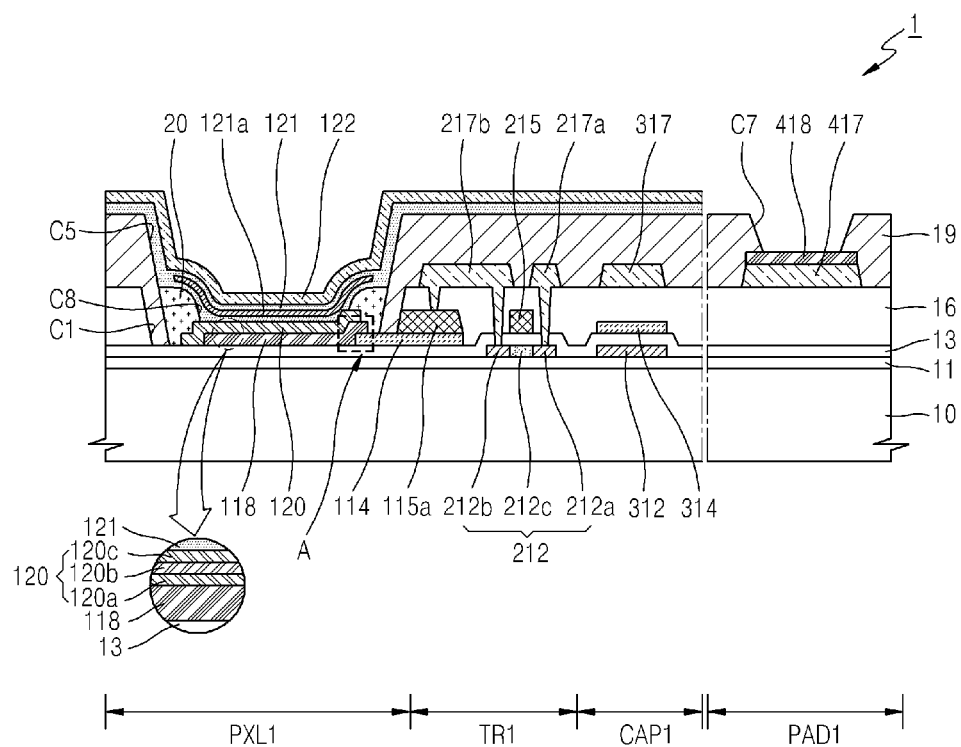
FIG. 2 is a schematic cross-sectional view of pixels and a portion of a pad unit of the OLED display of FIG. 1.

FIG. 1 is a schematic plan view of an organic light-emitting diode (OLED) display 1 according to an embodiment. FIG. 2 is a schematic cross-sectional view of a pixel P and a portion of a pad unit PAD of the OLED display 1 shown in FIG. 1.

Referring to FIG. 1, the OLED display 1 includes a substrate 10 including a plurality of pixels P, a display area DA on which an image is displayed, and a pad unit PAD. The display area DA is formed inside a sealing line SL and an encapsulation material (not shown) encapsulating the display DA is formed along the sealing line SL.

Referring to FIG. 2, the OLED display 1 includes a pixel area PXL1 including at least one organic light-emitting layer 121a, a transistor area TR1 including at least one thin film transistor (TFT), a capacitor area CAP1 including at least one capacitor, and a pad area PAD1, each formed on the substrate 10.

The substrate 10 may be a glass substrate or a plastic substrate including polyethylen terephthalate (PET), polyethylene naphthalate (PEN), or polyimide.

A buffer layer 11 may be further included on the substrate 10 in order to form a flat surface at the top of the substrate 10 and to prevent impurities from penetrating through the substrate 10. The buffer layer 11 may be formed of silicon nitride and/or silicon oxide and may be formed as a single layer or multiple layers.

The TFT includes an activation layer or active layer 212, a gate electrode 215, a source electrode 217a, and a drain electrode 217b.

The activation layer 212 may include a channel area 212c, a source area 212a, and a drain area 212b where ion impurities are doped on outer portions of the channel area 212c. The activation layer 212 may be formed to include various materials. For example, the activation layer 212 may include inorganic semiconductor materials such as amorphous silicon or crystalline poly silicon. As another example, the activation layer 212 may include oxide semiconductors. Alternatively, the activation layer 212 may include organic semiconductor materials.

A first insulating layer 13 that is a gate insulating film is formed on the activation layer 212 and the gate electrode 215 is formed on the first insulating layer 13 in a location corresponding to the channel area 212c.

The gate electrode 215c may be formed of at least one material such as aluminum (Al), platinum (Pt), palladium (Pd), silver (Ag), magnesium (Mg), gold (Au), nickel (Ni), neodymium (Nd), iridium (Ir), chrome (Cr), Lithium (Li), calcium (Ca), molybdenum (Mo), titanium (Ti), tungsten (W), or copper (Cu), and may be formed as a single layer or multiple layers.

A second insulating layer 16 that is an interlayer insulating layer is formed on the gate electrode 215 and the source and drain electrodes 217a and 217b are formed on the second insulating layer 16.

The source and drain electrodes 217a and 217b are respectively electrically connected to the source and drain areas 212a and 212b of the activation layer 212 through an aperture (not shown) formed in the second insulating layer 16. The source and drain electrodes 217a and 217b may be formed by stacking at least two layers of different metals having different electron mobility. For example, the source and drain electrodes 217a and 217b may be formed as multiple metal layers including at least one material such as Al, Pt, Pd, Ag, Mg, Au, Ni, Nd, Ir, Cr, Li, Ca, Mo, Ti, W, or Cu.

Although not illustrated in FIG. 2, wiring such as data wiring (not shown) and electrode power supply wiring (not shown) formed of the same material as the source and drain electrodes 217a and 217b may be formed on the same layer as the source and drain electrodes 217a and 217b.

The first and second insulating layers 13 and 16 may be inorganic insulating layers. The first and second insulating layers 13 and 16 may be formed of at least one material such as silicon dioxide ($SiO_2$), silicon nitride ($SiN_x$), silicon oxynitride (SiON), aluminum oxide ($Al_2O_3$), titanium dioxide ($TiO_2$), tantalum pentoxide ($Ta_2O_5$), hafnium oxide ($HfO_2$), Zirconium dioxide ($ZrO_2$), barium strontium titanate (BST), or lead zirconate titanate (PZT) and may be formed as a single layer or multiple layers.

A third insulating layer 19 is formed on the second insulating layer 16 in order to cover the source and drain electrodes 217a and 217b.

The third insulating layer 19 may be formed as a single organic insulating layer or multiple organic insulating layers.

The third insulating layer 19 may include general commercial polymers (PMMS, PS), polymer derivatives having a phenol group, an acryl-based polymer, an imide-based polymer, an aryl ether-based polymer, an amide-based polymer, a fluorine-based polymer, a p-xylene-based polymer, a vinyl alcohol-based polymer, or blends thereof.

The pixel area PXL1 includes a pixel electrode 120, an opposite electrode 122 formed facing the pixel electrode 120, and the intermediate layer 121 including the organic light-emitting layer 121a interposed between the pixel electrode 120 and the opposite electrode 122.

The TFT illustrated in FIG. 1 includes a driving transistor for driving an OLED. Only the driving transistor is illustrated in FIG. 1, however, the OLED display 1 may further include a switching transistor (not shown) or a compensation transistor (not shown).

The structure of the TFT illustrated in FIG. 1 is one embodiment of the TFT included in the OLED display 1, but the described technology is not limited to the TFT structure illustrated in FIG. 1.

The pixel electrode 120 includes a semi-permeable material. In detail, the pixel electrode 120 includes a semi-permeable metal layer 120b. First and second transparent conductive oxide layers 120a and 120c that respectively include a transparent conductive oxide may be further be respectively formed above and below the semi-permeable metal layer 120b.

The semi-permeable metal layer 120b may be formed of silver (Ag) or silver (Ag) alloys. Also, the semi-permeable metal layer 120b has a micro-cavity structure together with the opposite electrode 122 that is a reflective electrode, thus improving luminescence efficiency of the OLED display 1.

The first and second transparent conductive oxide layers 120a and 120c may include at least one material such as indium tin oxide (TTO), indium zinc oxide (IZO), zinc oxide (ZnO), indium oxide ($In_2O_3$), indium gallium oxide (IGO), or aluminum zinc oxide (AZO).

The first transparent conductive oxide layer 120a formed below the semi-permeable metal layer 120b increases the adhesion between the pixel electrode 120 and the first insulating layer 13.

The second transparent conductive oxide layer 120c formed above the semi-permeable metal layer 120b functions as a barrier layer protecting the semi-permeable metal layer 120b.

When the metals that form the semi-permeable metal layer 120b have high reducibility like silver they receive electrons during the etching for patterning the pixel electrode 120 and silver (Ag) ions included in the etchant may be re-deposited as silver (Ag). The re-deposited silver (Ag) may contribute to the generation of dark spots in a subsequent process for forming the pixel electrode 120.

In the process of etching the pixel electrode 120 including silver (Ag), when the source and drain electrodes 217a and 217b, or wirings such as data wirings (not shown) and electrode power supply wirings (not shown) that are formed of the same material as in the source and drain electrodes 217a and 217b are exposed to the etchant, the silver (Ag) ions having high reducibility may receive electrons from the metal materials and re-deposit silver (Ag). For example, when the metals include Mo or Al, Mo may provide the electrons received from Al to the silver (Ag) ions so that silver (Ag) may be re-deposited. The re-deposited silver (Ag) particles may be re-attached to the pixel electrode 120 in the subsequent process and may contribute to the generation of dark spots.

However, while patterning the pixel electrode 120, the OLED display 1 is protected since it is covered by the third insulating layer 19 that is an organic layer which will be further described later. Accordingly, while etching the pixel electrode 120, the re-deposited silver (Ag) particles prevented from being re-attached to the pixel electrode 120, thereby preventing the generation of dark spots.

The pixel electrode 120 is formed in an aperture or opening C1 formed in the second insulating layer 16 and an aperture C5 formed in the third insulating layer 19. An end of the pixel electrode 120 is forming in the aperture C5 defined in the third insulating layer 19 and does not extend to the top of the third insulating layer 19.

The aperture C5 formed in the third insulating layer 19 is smaller than the aperture C1 formed in the second insulating layer 16. The aperture C1 formed in the second insulating layer 16, the aperture C5 formed in the third insulating layer 19, and an aperture C8 formed in the fourth insulating layer or pixel defining layer 20 overlap each other.

The aperture C8 exposing the top of the pixel electrode 120 is formed in the fourth insulating layer 20 and the fourth insulating layer 20 covers the ends of the pixel electrode 120 so as to reduce the influence of an electric field on the ends of the pixel electrode 120. A portion of the fourth insulating layer 20 that covers the end of the pixel electrode 120 is not formed over the third insulating layer 19, but is only formed in the aperture C5 formed in the third insulating layer 19.

The thickness of the fourth insulating layer 20 is less than that of the third insulating layer 19, and thus, the portion of the fourth insulating layer 20 that covers the end of the pixel electrode 120 is formed only in the aperture C5 formed in the third insulating layer 19.

The fourth insulating layer 20 may be formed of the same material as the organic insulating layer including general commercial polymers (PMMS, PS), polymer derivatives having a phenol group, an acryl-based polymer, an imide-based polymer, an aryl ether-based polymer, an amide-based polymer, a fluorine-based polymer, a p-xylene based polymer, or a vinyl alcohol-based polymer.

The fourth insulating layer 20 including an organic insulating material has high absorption coefficients, and thus, during manufacturing, an out gassing affecting the lifespan of the OLED may occur. When the amount of the fourth insulating layer 20 increases, the effect of the out gassing may also increase. However, since the fourth insulating layer 20 is not formed over the third insulating layer 19 and is only formed in the aperture C5 formed in the third insulating layer 19, the amount of material forming the fourth insulating layer 20 decreases. Therefore, the out gassing effect may be reduced.

Figure 3:
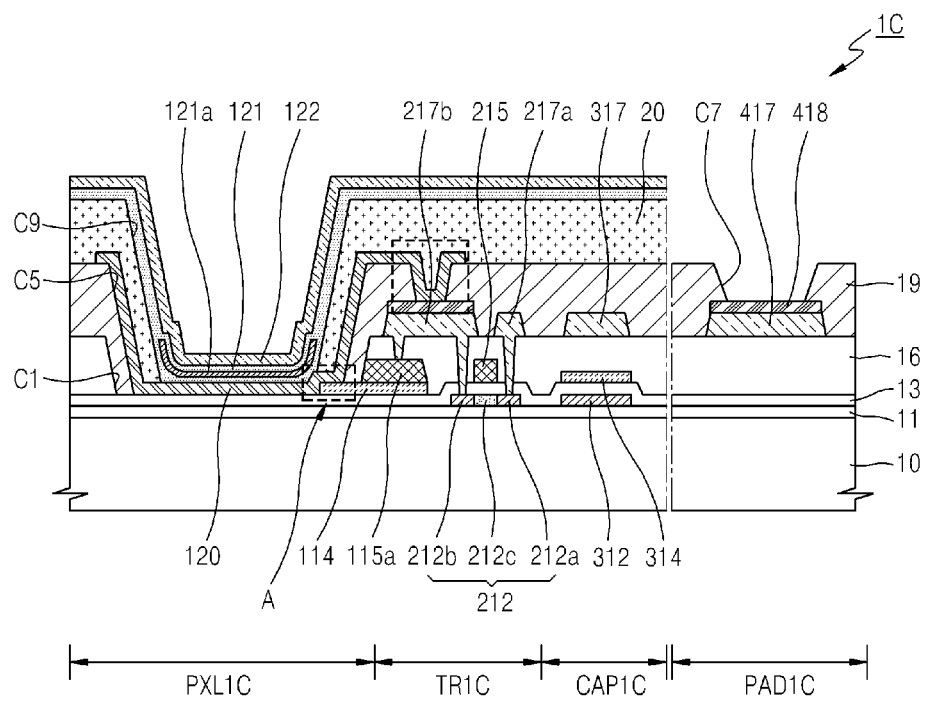
FIG. 3 is a schematic cross-sectional view of pixels and a portion of a pad unit of an OLED display according to a comparative example.

FIG. 3 is a schematic cross-sectional view of pixels and a pad unit of an OLED display 1C according to a comparative example.

Referring to FIG. 3, the pixel area PXL1C includes at least one organic light-emitting layer 121a, a transistor area TR1C including at least one TFT, a capacitor area CAP1C including at least one capacitor, and a pad unit PAD1C each formed on a substrate 10 of the OLED display 1C according to the comparative example.

In the previous embodiment described above, the end of the pixel electrode 120 is formed in the aperture C5 defined in third insulating layer 19. However, in the OLED display 1C according to the comparative example, the end of the pixel electrode 120 extends to the top of the third insulating layer 19. That is, the fourth insulating layer 20 covering the end of the pixel electrode 120 is formed not only in the aperture C5 formed in the third insulating layer 19 but also over the third insulating layer 19. Therefore, the amount of material of the fourth insulating layer 20 is greater in the comparative example than in the previous embodiment. Accordingly, since the amount of out gassing increases due to the increases volume of the fourth insulating layer 20, the lifespan of the OLED device decreases.

Referring again to FIG. 2, a first pad layer 417 is formed in an area exposed by a contact hole C7 formed in the third insulating layer 19. A second pad layer 418 that is a protection layer is formed over the first pad layer 417. Therefore, while etching the pixel electrode 120, the first pad layer 417 is not exposed to the etchant, and defects caused by re-deposition of silver (Ag) may be prevented.

Although not illustrated in FIG. 1, the intermediate layer 121 including the organic light-emitting layer 121a is formed between the pixel and opposite electrodes 120 and 122. The intermediate layer 121 may include at least one of a hole injection layer (HIL), a hole transport layer, an electron transport layer, and an electron injection layer. However, this described technology is not limited thereto, and the intermediate layer 121 may include various other functional layers.

The OLED device illustrated in FIG. 2 shows an embodiment of a sub-pixel forming a unit pixel and the sub-pixel may emit light of various colors. For example, the sub-pixel may emit red, green, or blue light.

As another example, the sub-pixel may emit white light. When the sub-pixel emits the white light, the OLED display 1 may further include a color converting layer or a color filter that converts the white light into another color of light. The sub-pixel emitting the white light may have diverse structures. For example, the sub-pixel may have a structure in which light-emitting materials emitting red, green, and blue light are stacked.

In addition, the sub-pixel emitting the white light may include a structure in which light-emitting materials emitting at least red, green, and blue light are mixed.

Red, green, and blue light are given as an example, but the described technology is not limited thereto. That is, when the white light is emitted, a combination of colors other than red, green, and blue light is possible.

The opposite electrode 122 is formed on the organic light-emitting layer 121a as a common electrode formed over all of the pixels. In the embodiment of FIG. 2, the pixel electrode 120 is used as an anode and the opposite electrode 122 is used as a cathode. However, according to other embodiments, the polarities of both electrodes may be reversed.

The opposite electrode 122 may be a reflective electrode including a reflective material. The opposite electrode 122 may be formed as a single metal layer or multiple metal layers including at least one material such as Al, Mg, Li, Ca, or LiF.

The pixel electrode 120 is connected to pixel electrode contact units or pixel electrode contact layers 114 and 115a through a contact hole C2 (refer to FIG. 6D) formed in the third insulating layer 19. The pixel electrode contact units 114 and 115a are electrically connected to one of the source and drain electrodes of the driving transistor 217a and 217b, and thus, control the pixel electrode 120.

The pixel electrode contact units 114 and 115a include a first contact layer 114 formed of a transparent conductive oxide and a second contact layer 115a formed of the same material as in the gate electrode 215. An end A of the first contact layer 114 is formed protruded from the etched surfaces of the aperture C1 formed in the second insulating layer and the aperture C5 formed in the third insulating layer. Therefore, the pixel electrode 120 is electrically connected to the protruded first contact layer 114, and the first contact layer 114 contacts the second contact layer 115a.

The optical property control layer 118 is formed between the pixel electrode 120 and the first insulating layer 13. The optical property control layer 118 is formed of the same material as the second pad layer 418. The optical property control layer 118 may include transparent conductive oxides including TTO, IZO, ZnO, In$_2$O$_3$, IGO, or AZO.

The semi-permeable metal layer 120b of the pixel electrode 120 including silver (Ag) may react with the material of the first insulating layer 13 formed on the bottom of the pixel electrode 120. A first transparent conductive oxide layer 120a is formed below the semi-permeable metal layer 120b of the pixel electrode 120, but the semi-permeable metal layer 120b is not perfectly protected, since the first transparent conductive oxide layer 120a is relatively thin. According to some embodiments, the thickness of the first transparent conductive oxide layer 120a is only about 70 Å.

For example, when the first insulating layer 13 used as the gate insulating layer is a double-layer structure in which a silicon oxide layer and a silicon nitride layer are stacked in a direction from the buffer layer 11 to the optical property control layer 118, the silicon nitride layer formed over the first insulating layer 13 can be oxidized during a process due to various factors and a silicon oxide layer is formed on the surface of the silicon nitride layer.

When the optical property control layer 118 is not formed between the pixel electrode 120 and the first insulating layer 13, the silver (Ag) included in the semi-permeable metal layer 120b reacts with the silicon oxide layer formed on the surface of the silicon nitride layer and can be dispersed through a small hole formed in the first transparent conductive oxide layer 120a that is thinly formed below the semi-permeable metal layer 120b. As a result, the semi-permeable metal layer 120b generates a space and the dispersed silver (Ag) generates dark spots.

However, according to at least one embodiment, since the optical property layer 118 is formed between the first insulating layer 13 and the pixel electrode 120, the optical property control layer 118 may prevent formation of a material that may easily react with silver (Ag) from penetrating into the first insulating layer 13. Therefore, generation of dark spots due to the silver (Ag) particles may be substantially prevented by restricting the reaction of the silver (Ag) particles.

Figure 4:
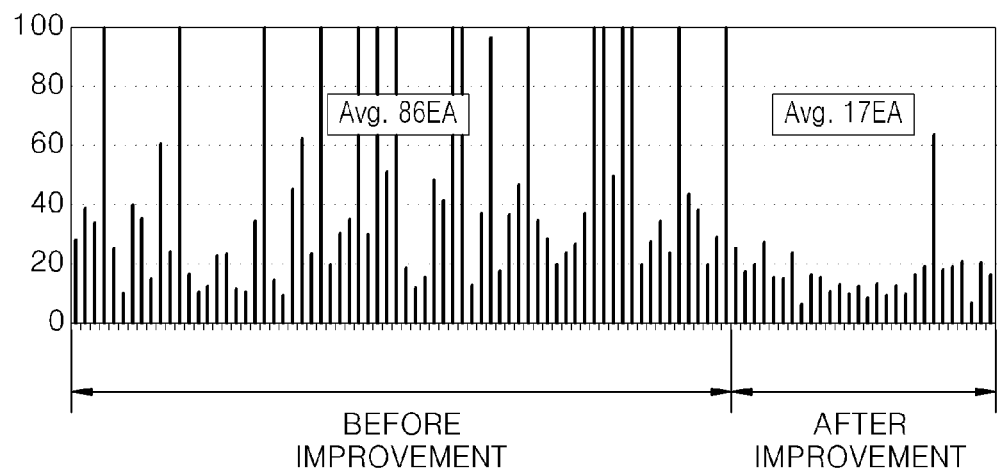
FIG. 4 is a graph illustrating the number of defective dark spots in the OLED display before and after a transparent protection layer is applied under the same conditions.

FIG. 4 illustrates the number of defective dark spots in the OLED display apparatus 1 before and after application of the optical property control layer 118 under the same conditions.

Referring to FIG. 4, the average number of dark spots before applying the optical property control layer 118 was 86, but after applying the optical property control layer 118, the average number of dark spots was 17, which indicates that the number of dark spots is greatly decreases when including the optical property control layer 118.

Thus, the optical property control layer 118 decreases the dark spots and also improves the luminescence efficiency of the OLED display 1.

Figure 5:
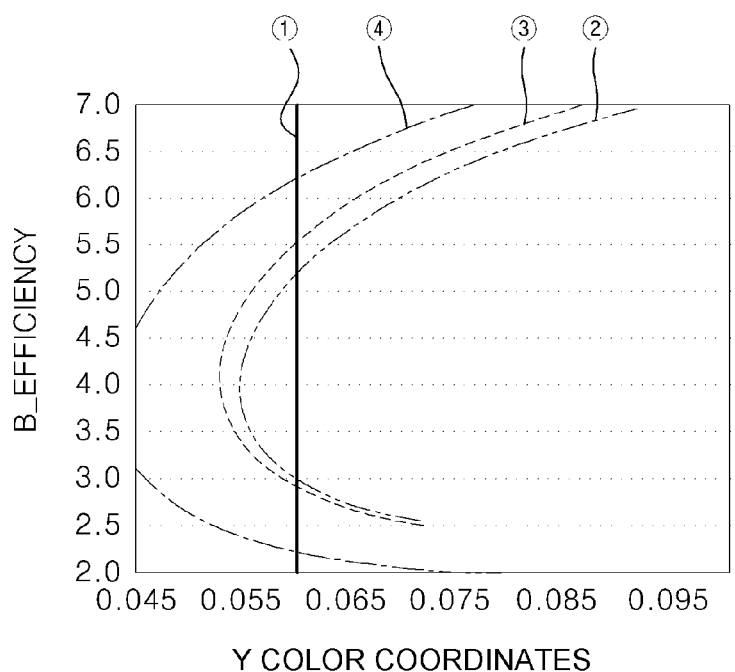
FIG. 5 is a graph illustrating the relationship between y color coordinates and efficiency of a blue light-emitting layer.

FIG. 5 is a graph illustrating the relationship between y color coordinates and efficiency of a blue light-emitting layer.

As shown in FIG. 5, ① is a curve for a structure (standard) without a transparent protection layer (optical property control layer), ② is a curve for when the thickness of the transparent protection layer is about 150 Å, ③ is a curve for when the thickness of the transparent protection layer is about 300 Å, and ④ shows the relationship between y color coordinates and efficiency of the blue light-emitting layer when the thickness of the transparent protection layer is about 370 Å. The transparent protection layer is formed of ITO for each of ② to ④. In each of ① to ④, ITO having a thickness of about 70 Å is used as a bottom protection layer 120a for the semi-permeable metal layer 120b.

As illustrated in FIG. 5, as the thickness of the ITO transparent protection layer increases, the range of selectable color coordinates widens and the efficiency improves in comparison with the standard structure. Meanwhile, although not illustrated in the above graph, when the thickness of ITO is at least 800 Å, the range of the color coordinates narrows and the efficiency no longer improves. Therefore, in consideration of the relationship between the restricting reaction with silver (Ag) and improvement of luminescence efficiency of the optical property control layer 118, the thickness of the optical property control layer 118 may be formed in a range of about 200 Å to 800 Å.

In the capacitor area CAP1, a capacitor is formed on the substrate 10 and includes a first electrode 312 arranged on the same layer as the activation layer 212, a second electrode 314 arranged on the same layer as the gate electrode 215, and a third electrode 317 arranged on the same layer as the source and drain electrodes 217a and 217b.

The first electrode 312 of the capacitor may be formed of a semiconductor, which is doped with ion impurities. In some embodiments, the semiconductor of the first electrode is doped with the same ion impurities as the source and drain areas 212a and 212b of the activation layer 212.

The second electrode 314 of the capacitor is formed on the first insulating layer 13 like the gate electrode 215, but the materials of the second electrode 314 and the gate electrode 215 are different. The material of the second electrode 314 may include a transparent conductive oxide. By forming the semiconductor doped with the ion impurities on the first electrode 312 through the second electrode 314, the capacitor may have a metal-insulator-metal (MIM) structure.

The third electrode 317 of the capacitor may be formed of the same material as the source and drain electrodes 217a and 217b. As illustrated above, the third electrode 317 is covered with the third insulating layer 19 that is the organic layer, and thus, the third electrode 317 is not exposed to the etchant including the silver (Ag) ions while etching the pixel electrode 120 including the silver (Ag). As a result, the particle-related defects caused by the re-deposition of the silver (Ag) may be substantially prevented. Also, by connecting the first and second electrodes with the capacitor in parallel, the capacitance of the OLED display may increase without increasing the area of the capacitor. Therefore, since the area of the capacitor may be reduced while increasing the capacitance thereof, the aperture ratio may be increased.

The pad area PAD 1 on which a pad electrode that is a terminal of an external driver is formed may be formed in an outer portion of the display area DA.

Like the source and drain electrodes 217a and 217b, the first pad layer 417 may include a plurality of metal layers having different electron mobility. For example, the first pad layer 417 may be formed as multiple layers formed of at least one metal such as Al, Pt, Pd, Ag, Mg, Au, Ni, Nd, Ir, Cr, Li, Ca, Mo, Ti, W, or Cu.

The second pad layer 418 may be formed of a transparent conductive oxide including at least one material such as TTO, IZO, ZnO, $In_2O_3$, IGO, or AZO. Exposure of the first pad layer 417 to moisture and oxygen is prevented, and thus, the reliability of the pad may be maintained.

As illustrated above, the first pad layer 417 is formed on an exposed area of the contact hole C7 formed in the third insulating layer 19, but the first pad layer 417 is not exposed to the etchant while etching the pixel electrode 120 because the second pad layer 418 that is a protection layer is formed over the first pad layer 417.

Furthermore, since the ends of the first pad layer 417 that is susceptible to environmental conditions such as moisture or oxygen is covered with the third insulating layer 19, the ends of the first pad layer 417 are not exposed to the etchant when etching the pixel electrode 120.

Therefore, the particle-related defects caused by the re-deposition of the silver (Ag) may be prevented thereby maintaining the reliability of the pad electrode.

Although not illustrated in FIG. 2, the OLED display 1 may further include an encapsulation member (not shown) for encapsulating the display area DA including the pixel area PXL1, the capacitor area CAP1, and the thin film transistor area TR1. The encapsulation member may be formed of an encapsulation thin film, etc. in which a substrate including a glass material, a metal film, or organic and inorganic insulating layers are alternatively arranged.

Hereinafter, a method of manufacturing the OLED display 1 will be described with reference to FIGS. 6A through 6I.

Figure 6A:
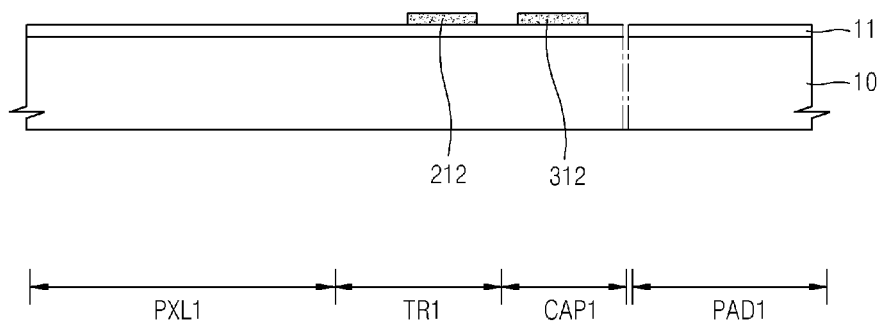
FIGS. 6A through 6I are schematic views illustrating a method of manufacturing an OLED display according to an embodiment.

FIG. 6A is a schematic cross-sectional view of a first mask process for forming the OLED display 1.

Referring to FIG. 6A, after the buffer layer 11 is formed on the substrate 10 and a semiconductor layer (not shown) is formed on the buffer layer 11, the activation layer 212 of the TFT and the first electrode 312 of the capacitor are formed by patterning the semiconductor layer (not shown).

Although not illustrated in the above drawing, photoresist (not shown) is spread on the semiconductor layer (not shown), and then the semiconductor layer is patterned through a photo lithography process using a first photo mask (not shown) so as to form the activation layer 212 and the first electrode 312. A first mask process through the photolithography process is performed through a series of processes such as developing, etching, and stripping or ashing after exposing the first photo mask (not shown) to light by using a light exposure apparatus.

The semiconductor layer (not shown) may be formed of amorphous silicon or crystalline silicon. In this regard, the crystalline silicon may be formed by crystallizing the amorphous silicon. Methods of crystallizing the amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, etc. The semiconductor layer (not shown) is not limited to amorphous or crystalline silicon, and may include an oxide semiconductor.

Figure 6B:
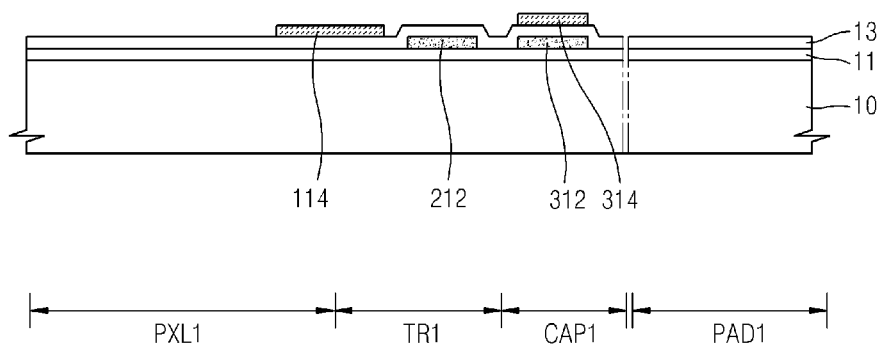

FIG. 6B is a schematic cross-sectional view of a second mask process for forming the OLED display 1.

The first insulating layer 13 is formed on the resulting substrate of the first mask process of FIG. 6A and a transparent conductive oxide layer (not shown) is formed and patterned on the first insulating layer 13.

As a result of the patterning, the first contact layer 114 of the pixel electrode contact unit and the second contact layer 314 of the capacitor are formed on the first insulating layer 13.

Figure 6C:
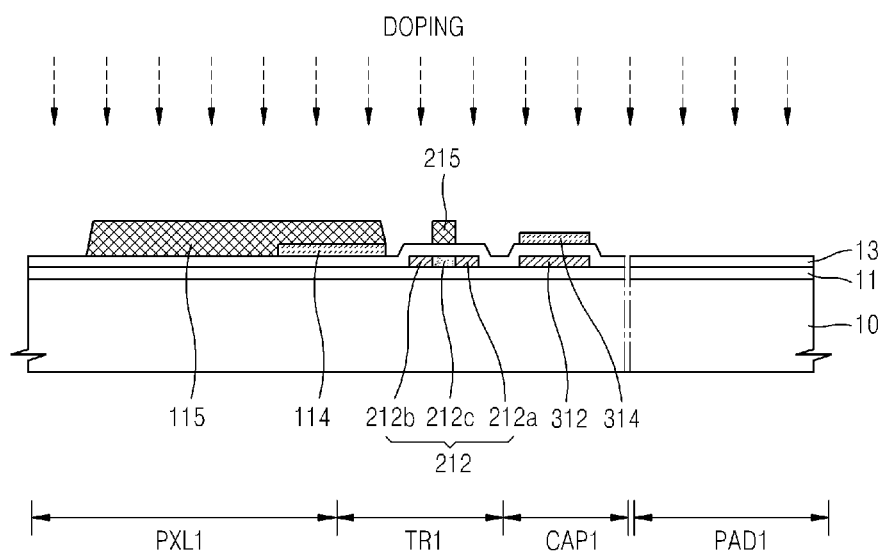

FIG. 6C is a schematic cross-sectional view of a third mask process for forming the OLED display 1.

In the third mask process, a first metal layer (not shown) is stacked and patterned on the resulting substrate of the second mask process. In this case, the first metal layer (not shown), as illustrated above, may be formed of at least one metal such as Al, Pt, Pd, Ag, Mg, Au, Ni, Nd, Ir, Cr, Li, Ca, Mo, Ti, W, or Cu, and may be formed as a single layer or multiple layers.

As a result of the patterning, a gate electrode 215 and a gate metal layer 115 covering the first contact layer 114 are formed on the first insulating layer 13.

The above structures are doped with the ion impurities. The ion impurities may be B or P ions and the activation layer 212 of the TFT and the first electrode 312 of the capacitor are doped as targets to a concentration of $1 \times 10^{15}$ atoms/cm$^2$ or greater.

The activation layer 212 is doped with the ion impurities by using the gate electrode 215 as a self-align mask and then the activation layer 212 includes the source and drain areas 212a and 212b, and the channel area 212c formed therebetween. In this case, the first electrode 312 of the capacitor is also doped with the ion impurities so that the first electrode 312 becomes an electrode for forming a MIM CAP.

Therefore, by simultaneously doping the activation layer 212 and the first electrode 312 of the capacitor through a one-time doping process, the manufacturing costs may be reduced due to a decrease in complexity of the doping process.

Figure 6D:
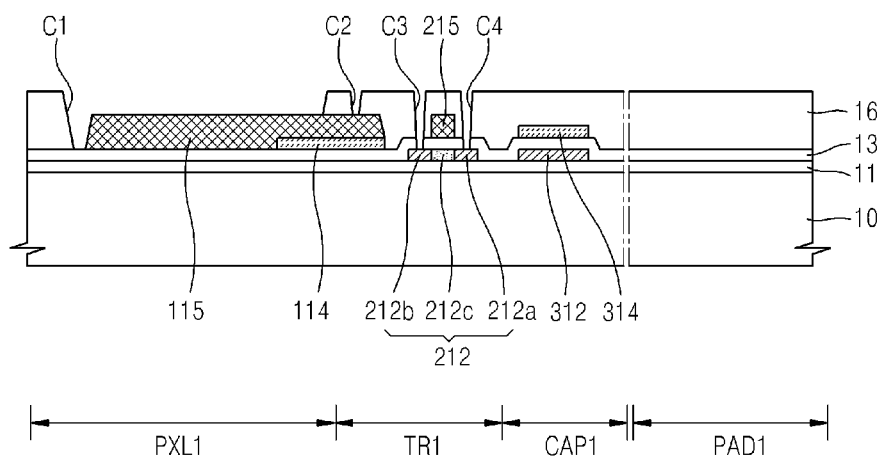

FIG. 6D is a schematic cross-sectional view of a fourth mask process for forming the OLED display 1.

Referring to FIG. 6D, the second insulating layer 16 is formed on the resulting substrate of the third mask process of FIG. 6C and by patterning the second insulating layer 16, apertures C3 and C4 are formed exposing the source and drain areas 212a and 212b of the activation layer 212. An aperture C1 is formed in an area corresponding to a side of the activation layer 212 as an area where a pixel electrode 120 is to be formed. An aperture C2 is also formed by the patterning of the second insulating layer 16.

Figure 6E:
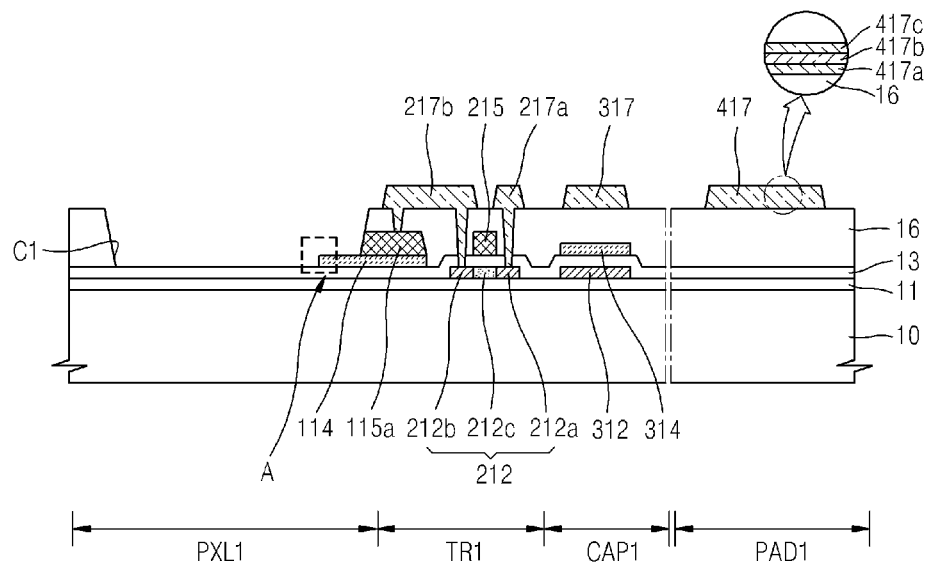

FIG. 6E is a schematic cross-sectional view of a fifth mask process for forming the OLED display 1.

Referring to FIG. 6E, a second metal layer (not shown) is formed on the resulting substrate of the fourth mask process of FIG. 6D and by patterning the second metal layer, the source electrode 217a, the drain electrode 217b, the third electrode 317 of the capacitor, and the first pad layer 417 of the pad electrode are formed at the same time.

The second metal layer may be formed by stacking at least two metal layers formed of different metals having different electron mobility. For example, a metal layer may be formed of at least one metal such as Al, Pt, Pd, Ag, Mg, Au, Ni, Nd, Ir, Cr, Li, Ca, Mo, Ti, W, Cu, or compounds thereof, and at least two metal layers may be stacked.

The configuration of the first pad layer 417 is illustrated in detail in order to exemplify a configuration of the second metal layer (not shown). For example, the second metal layer (not shown) may be formed of a first layer 417a including Mo, a second layer 417b including Al, and a third layer 417c including Mo.

The second layer 417b including Al is a metal layer having low resistance and excellent electrical characteristics, the first layer 417a that includes Mo and is formed under the second layer 417b may increase adhesion to the second insulating layer 16. The third layer 417c that includes Mo is formed over the second layer 417b and may function as a barrier layer for preventing hillocks of Al, oxidation, and dispersion.

Although not illustrated in detail in FIG. 6E, data wiring may be formed as well by patterning the second metal layer (not shown) in the fifth mask process.

Figure 6F:
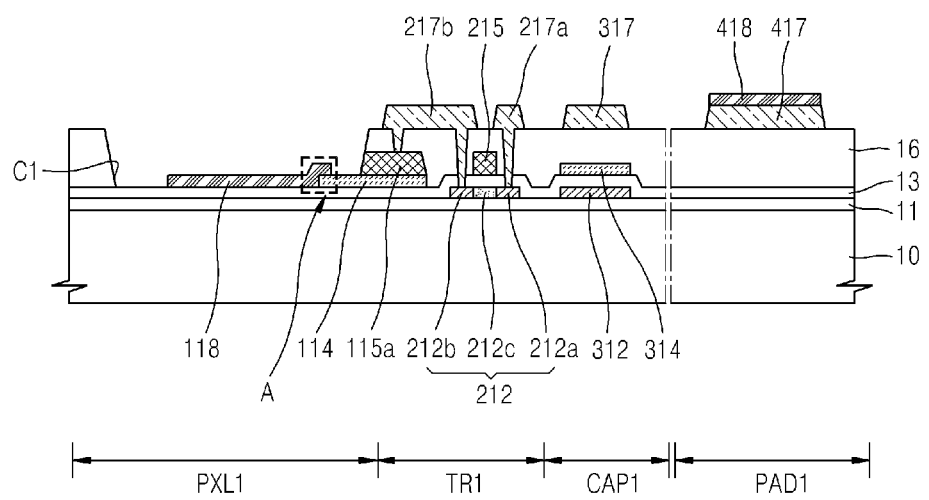

FIG. 6F is a schematic cross-sectional view of a sixth mask process for forming the OLED display 1.

Referring to 6F, the second pad layer 418 and the optical property control layer 118 are simultaneously formed on the resulting substrate of the fifth mask process of FIG. 6E.

Figure 6G:
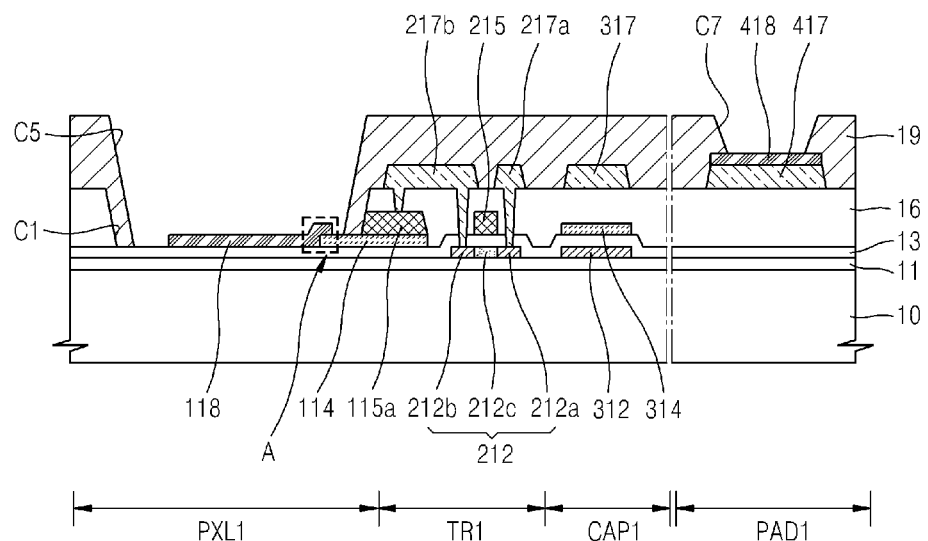

FIG. 6G is a schematic cross-sectional view of a seventh mask process for forming the OLED display 1.

Referring to FIG. 6G, the third insulating layer 19 is formed on the resulting substrate of the sixth mask process of FIG. 6F and by patterning the third insulating layer 19, the contact hole C7 is formed exposing the top of the second pad layer 418. An aperture C5 is also formed in the pixel area PXL1 in the patterning of the third insulating layer 19. The pixel electrode 120, which will be described later, is formed in the aperture C5.

The third insulating layer 19 is formed to completely cover the source and drain electrodes 217a and 217b, and thus, wirings having different potential differences are prevented from contacting the etchant in which the silver ions are included while etching the pixel electrode 120 including the silver (Ag).

The aperture C5 formed in the third insulating layer 19 and the aperture C1 formed in the second insulating layer 16 may overlap, however, the aperture C5 formed in the third insulating layer 19 is smaller than the aperture C1 formed in the second insulating layer 16.

Figure 6H:
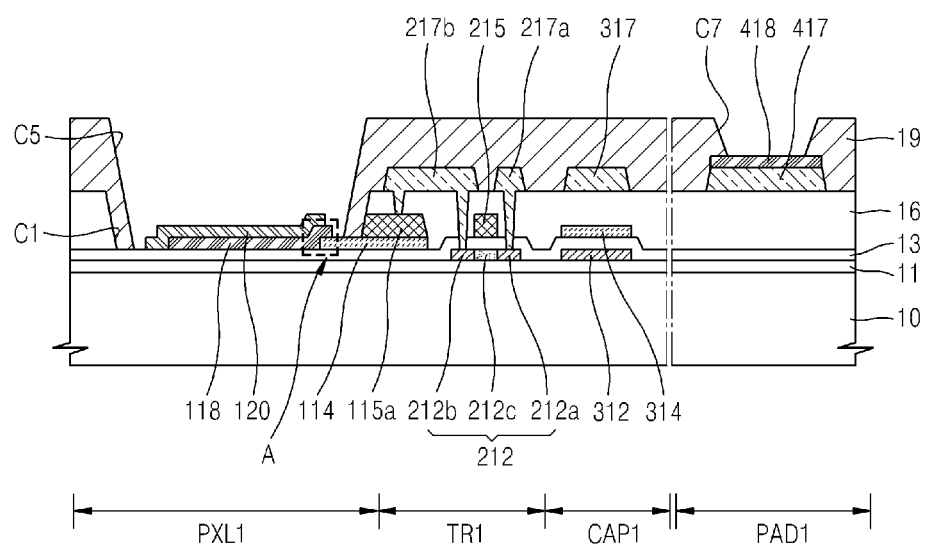

FIG. 6H is a schematic cross-sectional view of an eighth mask process for forming the OLED display 1.

Referring to FIG. 6H, a semi-permeable metal layer (not shown) is formed on the resulting substrate of the seventh mask process of FIG. 6G, and by patterning the semi-permeable metal layer, the pixel electrode 120 is formed.

The pixel electrode 120 is connected to the driving transistor through the pixel electrode contact units 114 and 115a, is arranged in the aperture C5 formed in the third insulating layer 19, and is formed on the optical property control layer 118.

The pixel electrode 120 is formed of the semi-permeable metal layer 120b. Also, the pixel electrode 120 is formed over and under the semi-permeable metal layer 120b. The pixel electrode 120 may further include the first and second transparent conductive oxide layers 120a and 120c for protecting the semi-permeable metal layer 120b.

The semi-permeable metal layer 120b may be formed of silver (Ag) or a silver alloy. The first and second transparent conductive oxide layers 120a and 120c may include at least one material such as ITO, IZO, ZnO, In$_2$O$_3$, IGO, or AZO. The semi-permeable metal layer 120b forms a micro-cavity structure together with an opposite electrode 122 that is a reflective electrode to be described later, thus improving the luminescence efficiency of the OLED display 1.

When metals having high reducibility like silver receive electrons during the etching process for patterning the pixel electrode 120, the silver ions included in the etchant may be re-deposited. During the etching process for the pixel electrode 120 including silver (Ag), if any of the source electrode 217a or the drain electrode 217b, the first contact layer 114 of the pixel electrode contact units 114 and 115a, the first pad layer 417, or data wiring (not shown) formed of the same material as the above-mentioned electrodes, layers, units, or wiring are exposed to the etchant, the silver ions having high reducibility may receive the electrons from the metals and the silver may be re-deposited.

However, according to at least one embodiment, the source and drain electrodes 217a and 217b are already patterned before the eighth mask process for patterning the pixel electrode 120 and are covered with the third insulating layer 19 that is the organic layer. Therefore, while etching the pixel electrode 120 including the silver (Ag), the source and drain electrodes 217a and 217b are not exposed to the etchant including the silver ions. As a result, defects resulting from the re-deposition of silver may be prevented.

Also, the first pad layer 417 is formed in an area exposed by the contact hole C7 formed in the third insulating layer 19, however, the second pad layer 418 that is the protection layer is formed over the first pad layer 417 so that the first pad layer 417 is not exposed to the etchant while etching the pixel electrode 120. Accordingly, defects caused by the re-deposition of silver may be prevented.

When there is no optical property control layer 118 between the pixel electrode 120 and the first insulating layer 13, the silver (Ag) included in the semi-permeable metal layer 120b may react with the silicon oxide layer formed on the surface of the silicon nitride layer and may be dispersed through a small hole in the first transparent conductive oxide layer 120a that is thinly formed at the bottom of the semi-permeable metal layer 120b. Accordingly, the semi-permeable metal layer 120b generates a space, and the dispersed silver (Ag) may generate defective dark spots.

However, according to at least one embodiment, the optical property control layer 118 is formed between the first insulating layer 13 and the pixel electrode 120, and thus, the transparent protection layer 19 may block the formation of a material that may easily react with the silver (Ag). Therefore, by restricting the reaction of the silver particles, the generation of dark spots due to the re-deposition of silver particles may be substantially prevented.

Figure 6I:
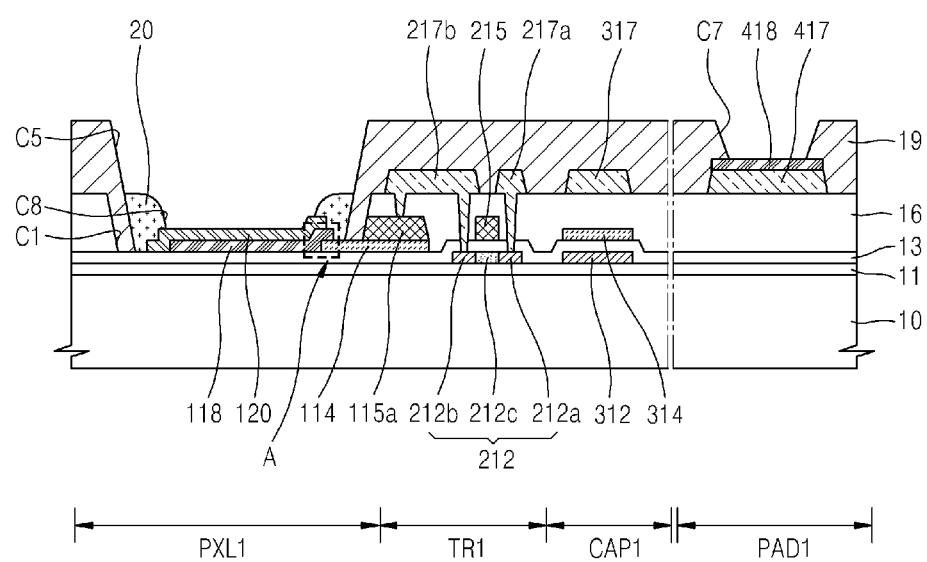

FIG. 6I is a schematic cross-sectional view of a ninth mask process for forming the OLED display 1.

Referring to 6I, the fourth insulating layer 20 is formed on the resulting substrate of the eighth mask process of FIG. 6H and then the ninth mask process that forming the aperture C8 exposing the top of the pixel electrode 120 is performed.

The fourth insulating layer 20 for covering the end of the pixel electrode 120 is not formed over the third insulating layer 19, but is formed in the aperture C5 formed in the third insulating layer 19.

The fourth insulating layer 20 may be formed of the organic insulating layer including general commercial polymers (PMMS, PS), polymer derivatives having a phenol group, an acryl-based polymer, an imide-based polymer, an aryl ether-based polymer, an amide-based polymer, a fluorine-based polymer, a p-xylene-based polymer, a vinyl alcohol-based polymer, etc.

The fourth insulating layer 20 including the organic insulating materials has high absorption coefficients so that during the manufacturing procedure, the out gassing that affects the lifespan of the OLED may be reduced. When the amount of material forming the fourth insulating layer 20 increases, the influence of the out gassing also increases. However, in the embodiment of FIG. 6I, since the fourth insulating layer 20 is not formed over the third insulating layer 19 but is only formed in the aperture C5 formed in the third insulating layer 19 where the pixel electrode 120 is formed, the amount of material forming the organic insulating layer forming the fourth insulating layer 20 is reduced. Thus, the out gassing may be reduced.

The intermediate layer 121 including the organic light-emitting layer 121a (refer to FIG. 2) is formed on the resulting substrate of the ninth mask process of FIG. 6I and then the opposite electrode 122 (refer to FIG. 2) is formed.

According to at least one embodiment, by forming the micro-cavity structure with the opposite electrode 122 and the semi-permeable metal layer 120b, the luminescence efficiency of the OLED display 1 can be improved.

Also, by using the structure where the source and drain electrodes 217a and 217b are covered with the third insulating layer 19 that is the organic layer, the source and drain electrodes 217a and 217b are not exposed to the etchant including the silver ions, and thus, defects caused by the re-deposition of silver (Ag) is prevented.

In addition, by forming the second pad layer 418 that is the protection layer over the first pad layer 417 in order prevent the first pad layer 417 from being exposed to the etchant while etching the pixel electrode 120, defects caused by the re-deposition of silver (Ag) is prevented.

Since the optical property control layer 118 is formed under the pixel electrode 120, the optical property control layer 118 may block the penetration of materials that may easily react with silver (Ag). As a result, the reactivity of the silver (Ag) particles is restricted so that the generation of defective dark spots due to the re-deposition of silver particles may be substantially prevented, thereby improving the luminescence efficiency.

Hereinafter, another embodiment will be described with reference to FIG. 7.

Figure 7:
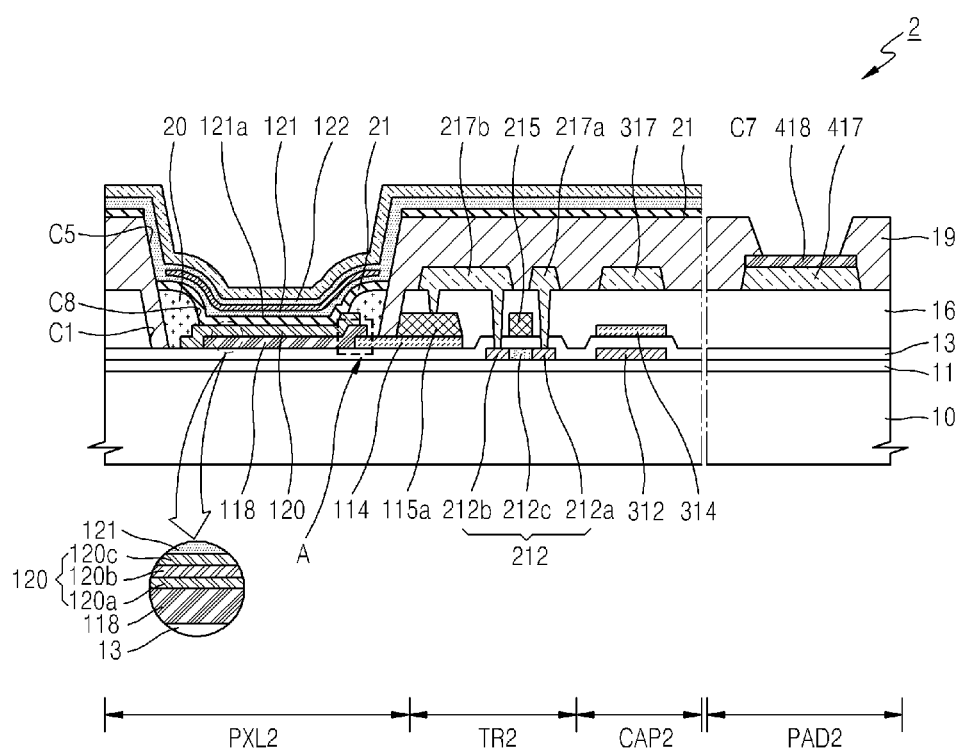
FIG. 7 is a schematic view of pixels and a portion of a pad unit of an OLED display according to an embodiment.

FIG. 7 is a schematic cross-sectional view of a pixel and a pad unit of an OLED display 2. Hereinafter, the differences between the OLED displays 1 and 2 will be described.

Referring to FIG. 7, a pixel area PXL2 is formed on the substrate 10 and includes at least one organic light-emitting layer 121a, a transistor area TR2 including at least one TFT, a capacitor area CAP2 including at least one capacitor, and a pad area PAD2.

The OLED display 2 may include all components of the OLED display 1 described above.

As described above, the pixel electrode 120 is arranged in the aperture C1 formed in the second insulating layer 16 and the aperture C5 formed in the third insulating layer 19. The end of the pixel electrode 120 is formed inside the aperture C5 formed in the third insulating layer 19 and does not extend over the third insulating layer 19.

The portion of the fourth insulating layer 20 covering the ends of the pixel electrode 120 is not formed to the top of the third insulating layer 19, but is formed only in the aperture C5 formed in the third insulating layer 19. Therefore, the amount of material forming the fourth insulating layer 20 including the organic insulating materials having high absorption coefficients is relatively low so that the amount of the out gassing may be decreased.

However, the third insulating layer 19 that functions as a planarization layer also includes the organic insulating materials having high absorption coefficients, and thus, the amount of out gassing in the third insulating layer 19 that includes a relatively large amount of material, may be high.

In the embodiment of FIG. 7, the top surfaces of the third and fourth insulating layers 19 and 20 including the organic insulating materials are cladded with a cladding layer 21, and thus, the out gassing generated in the third and fourth insulating layers 19 and 20 may not affect the light-emitting unit. Accordingly, the lifespan of the OLED can be improved.

As described above, according to at least one embodiment, the OLED display has high luminescence efficiency, high yield rate, and improved display quality.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the described technology have been described with reference to the figures, it will be understood by those of ordinary skill in the art that various changes in form and details may be made therein without departing from the spirit and scope of the present invention as defined by the following claims.

What is claimed is:

1. An organic light-emitting diode (OLED) display, comprising:
a thin film transistor comprising an active layer, a gate electrode, a source electrode, and a drain electrode;
a first insulating layer formed at least between the active layer and the gate electrode;
a second insulating layer formed at least between the gate, source, and drain electrodes;
a third insulating layer covering the source and drain electrodes, wherein an opening is defined in each of the second and third insulating layers and wherein the openings substantially overlap;
a pixel electrode formed in the openings defined in the second and third insulating layers and comprising a semi-permeable metal layer;
a pixel defining layer formed only in the opening defined in the third insulating layer, wherein the pixel defining layer is formed to cover ends of the pixel electrode;

an intermediate layer formed over the pixel electrode and comprising an organic light-emitting layer; and an opposite electrode formed over the intermediate layer and comprising a reflective material.

2. The OLED display of claim 1, wherein the thickness of the pixel defining layer is less than that of the third insulating layer.

3. The OLED display of claim 1, wherein the third insulating layer comprises an organic insulating layer.

4. The OLED display of claim 1, wherein the pixel defining layer comprises an organic insulating layer.

5. The OLED display of claim 1, further comprising a pixel electrode contact unit formed between the first and second insulating layers, wherein the pixel electrode is electrically connected to one of the source and drain electrodes through the pixel electrode contact unit.

6. The OLED display of claim 5, wherein the pixel electrode contact unit comprises:

a first contact layer extending to the openings defined in the second and third insulating layers; and a second contact layer interposed between the first contact layer and the second insulating layer.

7. The OLED display of claim 1, further comprising an optical property control layer interposed between the first insulating layer and the pixel electrode.

8. The OLED display of claim 7, wherein the thickness of the optical property control layer is in the range of about 200 Å to about 800 Å.

9. The OLED display of claim 7, wherein the optical property control layer is formed at least partially of a transparent conductive oxide material.

10. The OLED display of claim 1, wherein the semi-permeable metal layer comprises silver (Ag) or a silver alloy.

11. The OLED display of claim 1, wherein the source and drain electrodes comprise a plurality of layers formed of different metals having different electron mobilities.

12. The OLED display of claim 11, wherein each of the source and drain electrodes comprises a first layer comprising molybdenum and a second layer comprising aluminum.

13. The OLED display of claim 1, further comprising a capacitor comprising a first electrode formed on the same layer as the active layer and a second electrode formed on the same layer as the gate electrode.

14. The OLED display of claim 13, wherein the first electrode of the capacitor comprises a semiconductor material doped with ion impurities.

15. The OLED display of claim 13, wherein the second electrode of the capacitor is formed at least partially of a transparent conductive oxide material.

16. The OLED display of claim 7, further comprising:

a first pad layer formed of the same material as each of the source and drain electrodes; and a second pad layer formed over the first pad layer.

17. The OLED display of claim 16, wherein the second pad layer is formed of the same material as the optical property control layer.

18. The OLED display of claim 1, further comprising a covering layer covering the third insulating layer and the pixel defining layer.

19. The OLED display of claim 18, wherein the covering layer is formed at least partially of a transparent conductive oxide material.

20. An organic light-emitting diode (OLED) display, comprising:

a substrate;

an insulating layer formed over the substrate, wherein an opening is defined in the insulating layer;

an optical property control layer formed in the opening;

a pixel electrode formed over the optical property control layer and in the opening, wherein the pixel electrode comprises a semi-permeable metal layer; and a pixel defining layer formed over ends of the pixel electrode, wherein the pixel defining layer is formed only in the opening.

* * * * *